US011923766B2

(12) United States Patent
Jin et al.

(10) Patent No.: US 11,923,766 B2
(45) Date of Patent: Mar. 5, 2024

(54) APPARATUS AND APPROACH TO ACTIVELY BALANCE THERMAL PERFORMANCE OF PARALLELED DEVICES

(71) Applicant: SANTAK ELECTRONIC (SHENZHEN) CO., LTD., Shenzhen (CN)

(72) Inventors: Dongxin Jin, Shenzhen (CN); Tian Jing, Shenzhen (CN); Hualiang Li, Shenzhen (CN); Huafen Ouyang, Shenzhen (CN); Dawei Zheng, Shenzhen (CN)

(73) Assignee: SANTAK ELECTRONIC (SHENZHEN) CO., LTD., Shenzhen (CN)

( * ) Notice: Subject to any disclaimer, the term of this patent is extended or adjusted under 35 U.S.C. 154(b) by 19 days.

(21) Appl. No.: 17/526,899

(22) Filed: Nov. 15, 2021

(65) Prior Publication Data
US 2022/0158543 A1    May 19, 2022

(30) Foreign Application Priority Data

Nov. 13, 2020    (CN) .......................... 202011266380.5

(51) Int. Cl.
*G01K 1/02*    (2021.01)
*G01K 3/00*    (2006.01)
(Continued)

(52) U.S. Cl.
CPC ............ *H02M 1/327* (2021.05); *G01K 1/026* (2013.01); *G01K 3/005* (2013.01); *G01K 7/22* (2013.01); *H02J 9/06* (2013.01); *H02M 1/08* (2013.01)

(58) Field of Classification Search
CPC ............ G01K 1/00; G01K 1/026; G01K 1/14; G01K 3/00; G01K 3/005; G01K 7/00;
(Continued)

(56) References Cited

U.S. PATENT DOCUMENTS 5,461,557 A * 10/1995 Tamagawa ....... H03K 3/356121
363/60
2011/0193628 A1* 8/2011 Pukhovski ................ H03F 1/30
330/127
(Continued)

FOREIGN PATENT DOCUMENTS

CN    103500557    1/2014
CN    103513668    1/2014
(Continued)

OTHER PUBLICATIONS

China National Intellectual Property Administration, Search Report, CN 2020112663805, dated Jul. 12, 2021, 6 pages.

*Primary Examiner* — Levi Gannon
(74) *Attorney, Agent, or Firm* — Stanek Lemon Crouse & Meeks, PA.

(57) ABSTRACT

The present invention provides an apparatus to actively balance the thermal performance of paralleled power devices, comprising: a monitoring unit for monitoring the temperature of each power device of the paralleled power devices to judge whether the temperature is out of balance; and a balancing unit for adjusting power loss of the power devices with monitored higher temperatures so as to achieve the balance of the thermal performance of the paralleled power devices.

4 Claims, 5 Drawing Sheets

(51) Int. Cl.
    *G01K 7/22*    (2006.01)
    *H02J 9/06*    (2006.01)
    *H02M 1/08*    (2006.01)
    *H02M 1/32*    (2007.01)

(58) Field of Classification Search
    CPC .. G01K 7/20; G01K 7/22; G01K 7/425; H02J 1/00; H02J 1/08; H02J 9/00; H02J 9/06; H02J 1/10; H02J 1/102; H02J 1/106; H02M 1/00; H02M 1/0054; H02M 1/08; H02M 1/088; H02M 1/32; H02M 1/327; H03K 17/00; H03K 17/14; Y02B 70/00; Y02B 70/10
    USPC ......................................................... 307/64
    See application file for complete search history.

(56) References Cited

U.S. PATENT DOCUMENTS

| | | | |
|---|---|---|---|
| 2016/0141950 A1 | 5/2016 | Goth et al. | |
| 2017/0164443 A1* | 6/2017 | Liu | H05B 45/56 |
| 2020/0373826 A1* | 11/2020 | Suzuki | H02M 1/327 |
| 2021/0091606 A1* | 3/2021 | Johnston | H02J 50/20 |

FOREIGN PATENT DOCUMENTS

| | | | | |
|---|---|---|---|---|
| CN | 104254170 | | 12/2014 | |
| CN | 107592059 | | 1/2018 | |
| CN | 108346409 | | 7/2018 | |
| CN | 108682672 | | 10/2018 | |
| JP | 2010-044895 A | * | 2/2010 | ............ Y02E 60/10 |
| JP | 2016092635 A | * | 5/2016 | ............ H04B 1/40 |

\* cited by examiner

APPARATUS AND APPROACH TO ACTIVELY BALANCE THERMAL PERFORMANCE OF PARALLELED DEVICES

CROSS-REFERENCE TO RELATED APPLICATIONS

The present application claims priority to Chinese Patent Application No. 202011266380.5; Filed Nov. 13, 2020, entitled APPARATUS AND APPROACH TO ACTIVELY BALANCE THERMAL PERFORMANCE OF PARALLELED DEVICES that is incorporated herein by reference in its entirety.

TECHNICAL FIELD

The present invention belongs to the field of electric power sources, in particular relates to an apparatus and approach to actively balance the thermal performance of paralleled power devices.

BACKGROUND ART

In the field of UPS, requirements on the power and efficiency of a power converter are higher and higher. For example, a power device of an IGBT is widely applied to a power converter, while a power device of an SiC MOSFET, for example, will be also applied to a power converter under the conditions of high switching frequency and high power density. In an application, in order to achieve higher power for a limited current and also balance the high cost of a higher-power device, a plurality of conventional power devices are generally required to be connected in parallel. However, for a UPS system including a plurality of paralleled power devices, a fault of any power device may affect the life of the overall UPS system. In the prior art, when a certain power device is faulted, the fault has to be solved by replacing the power device, which undoubtedly causes higher workload and higher cost.

SUMMARY OF THE INVENTION

Therefore, the objective of the present invention is to provide an apparatus to actively balance the thermal performance of paralleled power devices to overcome the aforementioned defects in the prior art. The apparatus includes:

a monitoring unit for monitoring the temperature of each power device of the paralleled power devices to judge whether the temperature is out of balance; and a balancing unit for adjusting power loss of the power devices with monitored higher temperatures so as to achieve the balance of the thermal performance of the paralleled power devices.

For the apparatus to actively balance the thermal performance of the paralleled power devices in accordance with the present invention, preferably, the monitoring unit includes a thermistor.

For the apparatus to actively balance the thermal performance of the paralleled power devices in accordance with the present invention, preferably, the thermistor is integrated or attached to each power device of the paralleled power devices.

For the apparatus to actively balance the thermal performance of the paralleled power devices in accordance with the present invention, preferably, the balancing unit adjusts the power loss of the power devices by adjusting one or more of a switching frequency, a gate driving voltage, gate driving resistance and capacitance and a DC bus voltage.

For the apparatus to actively balance the thermal performance of the paralleled power devices in accordance with the present invention, preferably, the balancing unit includes a hardware circuit, and an output end of the hardware circuit is connected to the gate of a corresponding power device so as to adjust the gate driving voltage of the corresponding power device.

For the apparatus to actively balance the thermal performance of the paralleled power devices in accordance with the present invention, preferably, the hardware circuit includes a first resistor, a negative temperature coefficient thermistor and a second resistor successively connected in series as well as a first capacitor and a second capacitor connected in series with each other, one end of the first resistor is connected to an input voltage anode, a node between the first resistor and the thermistor is connected to an output voltage anode, the end, not connected with the thermistor, of the second resistor is grounded, one end of the first capacitor is connected to the output voltage anode, the other end of the first capacitor is grounded and is connected to one end of the second capacitor, and the other end of the second capacitor is connected to an input voltage cathode and an output voltage cathode.

For the apparatus to actively balance the thermal performance of the paralleled power devices in accordance with the present invention, preferably, the hardware circuit includes a first resistor, a positive temperature coefficient thermistor and a second resistor successively connected in series as well as a first capacitor and a second capacitor connected in series with each other, one end of the first resistor is connected to an input voltage anode, a node between the second resistor and the thermistor is connected to an output voltage anode, the end, not connected with the thermistor, of the second resistor is grounded, one end of the first capacitor is connected to the output voltage anode, the other end of the first capacitor is grounded and is connected to one end of the second capacitor, and the other end of the second capacitor is connected to an input voltage cathode and an output voltage cathode.

For the apparatus to actively balance the thermal performance of the paralleled power devices in accordance with the present invention, preferably, the balancing unit includes a software control component used for adjusting one or more of the switching frequency, the gate driving voltage, the gate driving resistance, the capacitance and the DC bus voltage.

For the apparatus to actively balance the thermal performance of the paralleled power devices in accordance with the present invention, preferably, the software control component is used for performing the following steps:

judging whether a difference of the highest temperature and the lowest temperature is greater than a first threshold;

if the difference of the highest temperature and the lowest temperature is greater than the first threshold, reducing the gate driving voltage of the power device with the highest temperature;

further judging whether the difference of the highest temperature and the lowest temperature is greater than a second threshold and whether the highest temperature is greater than a third threshold;

if the difference of the highest temperature and the lowest temperature is greater than the second threshold or the highest temperature is greater than the third threshold, reducing the switching frequency of the power device with the highest temperature; and further judging whether the highest temperature is greater than a fourth threshold, if the highest temperature is greater than the fourth threshold, reducing the DC bus voltage of a system.

In another aspect, the present invention provides a UPS system including the apparatus to actively balance the thermal performance of the paralleled power devices in accordance with the present invention.

In further aspect, the present invention provides an approach to actively balance the thermal performance of paralleled power devices, including the following steps:

step 1: monitoring the temperature of each power device of the paralleled power devices to judge whether the temperature is out of balance; and step 2: adjusting power loss of the power devices with monitored higher temperatures so as to achieve the balance of the thermal performance of the paralleled power devices.

For the approach to actively balance the thermal performance of the paralleled power devices in accordance with the present invention, preferably, in the step 2, the power loss of the power devices is adjusted by adjusting one or more of a switching frequency, a gate driving voltage, gate driving resistance and capacitance and a DC bus voltage.

Compared with the prior art, the present invention has the advantages that the thermal performance of the paralleled power devices can be actively balanced, and the life of the paralleled power devices and the life of the UPS system including the paralleled power devices are prolonged.

BRIEF DESCRIPTION OF THE DRAWINGS

Embodiments of the present invention will be further described below with reference to accompanying drawings, in which.

DETAILED DESCRIPTION OF THE INVENTION

In order to make objectives, technical solutions and advantages of the present invention clearer and more understandable, the present invention will be further described in detail below in conjunction with the accompanying drawings and specific embodiments. It should be understood that the specific embodiments described herein are merely intended to explain the present invention, rather than to limit the present invention.

It is found by the inventor that junction temperatures of chips of power devices are keys to the simulation that a plurality of power devices are connected in parallel, and the temperature imbalance among all the power devices may affect the life imbalance of all the power devices, thereby further affecting the life of a power converter and even a UPS. Therefore, the life of the UPS system may be obviously prolonged by actively balancing the temperature of the power devices connected in parallel with each other.

The greatest challenge in a parallel application of the power devices is to result in temperature imbalance caused by imbalance of current and power loss due to differences of electric parameters of different devices and finally undertake overheating failure of higher-current power devices. Generally speaking, the temperature imbalance is mainly derived from the different internal parameters (such as threshold voltages and Miller capacitance) of the power devices and layout dissymmetry (different parasitic inductance and different parasitic resistance) of a converter. With the increment of the number of the paralleled power devices, the rated power will be increased, the overall deviation of the devices will become great, and finally, the thermal balance and performance of the devices are affected. For example, for a system including two power devices which are connected in parallel, it is assumed that the rated power loss of the devices is 480 W, the rated thermal impedance of a junction of the devices and a heat radiator is 0.18° C./W, and the environment temperature is 40° C., temperature distribution generated by imbalance of power loss is shown as the following table 1:

TABLE 1

|  | Environment temperature (° C.) | Thermal impedance (p.u.) | Power loss (p.u.) | Junction temperature at rated power (° C.) | Junction temperature when an overload reaches 10% (° C.) | Junction temperature when an overload reaches 15% (° C.) |
| --- | --- | --- | --- | --- | --- | --- |
| NO. 1 | 40.00 | 1.00 | 1.00 | 112.00 | 119.20 | 122.80 |
| NO. 2 | 40.00 | 1.00 | 1.25 | 130.00 | 139.00 | 143.50 |
| NO. 3 | 40.00 | 1.05 | 1.00 | 115.60 | 123.16 | 126.94 |
| NO. 4 | 40.00 | 1.05 | 1.25 | 134.50 | 143.95 | 148.68 |

If the dynamic change margin of a temperature of 15° C. and an upper limit of a junction temperature of 150° C. are taken into consideration, found by comparing NO. 1 with NO. 2, if the power loss is increased by 25% under the same thermal impedance, over-temperature may occur when two paralleled power tubes are imbalanced; found by comparing NO. 1 with NO. 3, the thermal impedance is increased by 5% under the same power loss, and it is also possible that the temperature of single power tube is very high due to temperature imbalance of the two power tubes; and found by comparing NO. 1 with NO. 4, if temperature imbalance occurs when the power loss and the thermal impedance are increased at the same time, the temperature of the single power tube may be very high.

Figure 1:
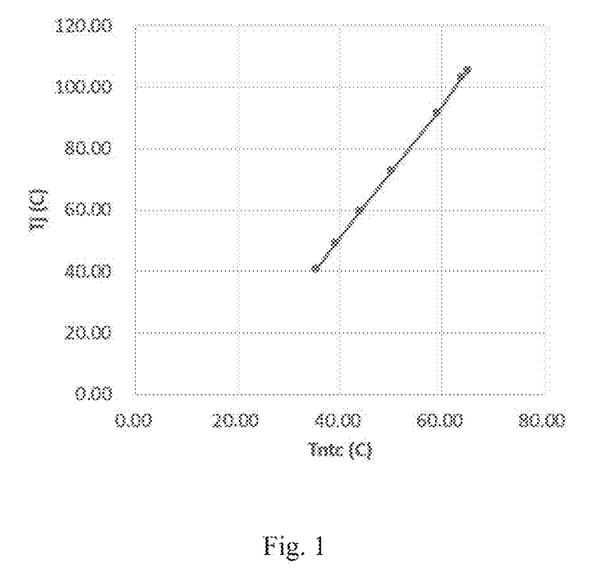
FIG. 1 shows a relationship, obtained by an experiment, between the temperature of a negative temperature coefficient (NTC) resistor and the junction temperature of a device.

A thermistor is a sensitive element and is divided into a positive temperature coefficient (PTC) thermistor and a negative temperature coefficient (NTC) thermistor according to different temperature coefficients. The thermistor has the typical characteristics of being sensitive to temperatures and showing different resistance values at different temperatures. The resistance value of the PTC thermistor is greater when the temperature is higher, and the resistance value of the NTC thermistor is smaller when the temperature is higher. The thermistor is integrated or attached to devices, the temperature of the thermistor may reflect the temperatures of the devices, as shown in FIG. 1 showing a relationship, obtained by an experiment, between the temperature of an NTC resistor and the junction temperature of devices, Tj=2.17*Tntc-36, wherein Tj represents the junction temperature of the devices, Tntc represents the temperature of the thermistor, it may be seen that a linear relationship is formed between the temperature of the thermistor and the junction temperature of the devices, and the thermistor is capable of directly reflecting the junction temperature of the devices.

The temperatures of the devices are mainly decided by heat generated by the devices and a cooling system, the heat generated by the devices is the power loss of the devices, and therefore, when heat radiation of the heat radiator is asymmetrical, temperature imbalance may be caused. A nonbalance state of paralleled devices may be detected by a thermistor (such as an NTC), and then, the power loss of the devices is actively controlled by hardware or software to achieve thermal balance.

In a switching mode, the power loss of the devices may be divided into three parts:
(A) conduction loss (Pc);
(B) switching loss (Psw); and
(C) leakage loss (Pb) which may be neglected usually.

The total loss (Ploss=Pc+Psw+Pb≈Pc+Psw) mainly depends on a switching frequency, a gate driving voltage, gate driving resistance and capacitance and a DC bus voltage, for example. Therefore, the power loss of the devices may be adjusted by adjusting one or more of the switching frequency, the gate driving voltage, the gate driving resistance and capacitance and the DC bus voltage, and finally, the thermal balance is achieved.

The inventor provides an approach to balance the thermal performance of paralleled power devices, including the following steps:
step 1: the temperature of each power device of the paralleled power devices is monitored to judge whether the temperature is out of balance; specifically, parameters, such as voltages, related to the temperatures of the devices are acquired by a thermistor, and then, the parameters related to the temperatures of the power devices are converted into the temperatures of the power devices; and
step 2: the power loss of the power devices is adjusted so as to achieve the balance of the thermal performance of the paralleled power devices; specifically, the power loss of the devices is adjusted by adjusting one or more of a switching frequency, a gate driving voltage, gate driving resistance and capacitance and a DC bus voltage, for example, a gate driver generates a device control signal to control the power loss of the power devices.

The approach may be achieved by adopting the apparatus to balance the thermal performance of the paralleled power devices. The apparatus includes:
a monitoring unit for monitoring the temperature of each power device of the paralleled power devices to judge whether the temperature is out of balance; and
a balancing unit for adjusting power loss of the power devices so as to achieve the balance of the thermal performance of the paralleled power devices.

Two specific examples of the approach and apparatus to balance the thermal performance of paralleled devices are given as follows.

First example (a balancing approach in which hardware is adopted)

Figure 2:
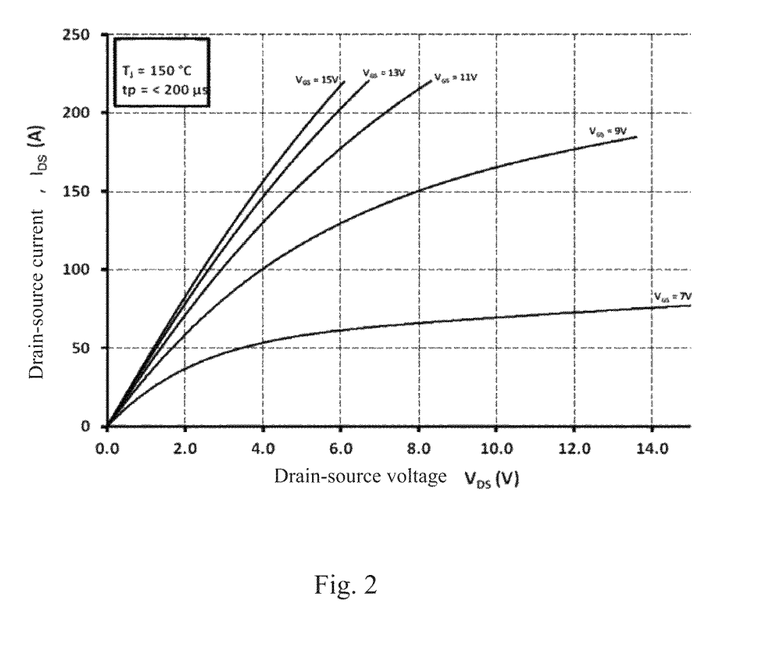
FIG. 2 shows a relationship curve between a drain-source voltage $V_{DS}$ and a drain-source current $I_{DS}$ of an MOSFET under the condition of different gate voltages $V_{GS}$.

Conduction loss mainly depends on on-resistance which is affected by a gate driving voltage. Reference is made to FIG. 2 showing a relationship curve between a drain-source voltage VDS and a drain-source current IDS of an MOSFET under the condition of different gate voltages VGS. It may be seen that the drain-source current IDS passing through the insides of the devices is increased with the increment of the gate driving voltages VGS, which means that the on-resistance Rds-on is reduced with the increment of the VGS. Therefore, if a plurality of devices are connected in parallel, the gate voltage VGS of a certain device may be reduced, so that the on-resistance Rds-on of the device is reduced, the drain-source current IDS of the device is reduced, finally, heat generated by the device is reduced, and thus, the temperature of the device is reduced, that is, the thermal performance of the device may be adjusted by adjusting the gate voltage of the device.

Figure 3:
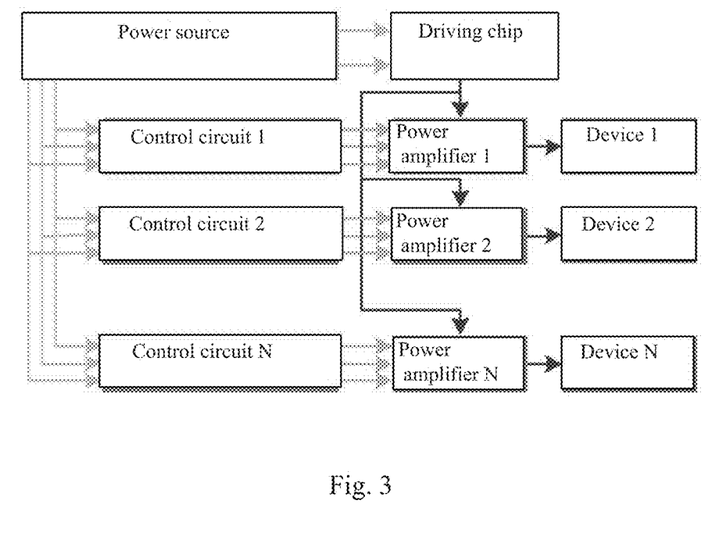
FIG. 3 shows a schematic structural diagram of a circuit to actively balance the thermal performance of paralleled power devices in a first example of the present invention.

Reference is made to FIG. 3 showing a schematic structural diagram of a circuit to actively balance the thermal performance of paralleled power devices in the first example, wherein a device 1, a device 2 . . . a device N are connected in parallel with each other, a driving chip sends a PWM signal for controlling an MOSFET to the devices 1 to N, the devices 1 to N are respectively provided with corresponding power amplifiers 1 to N, control circuits 1 to N respectively adjust gate voltages of the devices 1 to N via the power amplifiers 1 to N, and then, the thermal performance of the devices 1 to N is adjusted. An exemplary circuit diagram of any one of the control circuits 1 to N is shown as FIG. 4 in which the control circuit includes a first resistor R1, a negative temperature coefficient thermistor Rntc and a second resistor R2 successively connected in series as well as a first capacitor C1 and a second capacitor C2 connected in series with each other, one end of the first resistor R1 is connected to an input voltage anode Vi+, a node between the first resistor R1 and the thermistor Rntc is connected to an output voltage anode Vo+, the end, not connected with the thermistor Rntc, of the second resistor R2 is grounded, one end of the first capacitor C1 is connected to the output voltage anode Vo+, the other end of the first capacitor is grounded and is connected to one end of the second capacitor C2, and the other end of the second capacitor C2 is connected to an input voltage cathode Vi− and an output voltage cathode Vo−. The negative temperature coefficient thermistor Rntc in the control circuit is integrated in the devices or attached to the devices. Herein, an output voltage of the control circuit is applied to the gate of a corresponding device, and when the output voltage of the control circuit is changed, the gate voltage of the device is also changed therewith.

Figure 4:
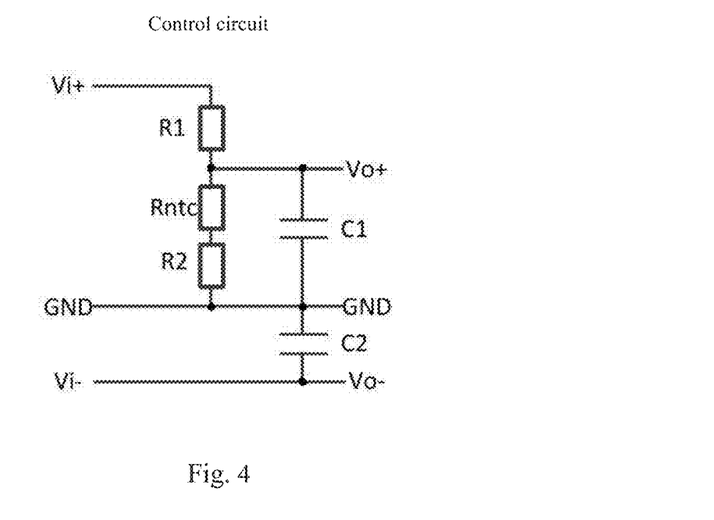
FIG. 4 shows an exemplary circuit diagram of a control circuit in the first example of the present invention.

When the temperature of the device is raised, the Rntc is reduced, the output voltage Vo+ is reduced, at the moment, the gate voltage Vgs of the device is reduced therewith, the on-resistance Rds-on of the device may be increased, the current Ids passing through the device may be reduced, the temperature of the device is reduced, and therefore, the control circuit is capable of automatically achieving the adjustment of the temperature of the device.

Figure 5:
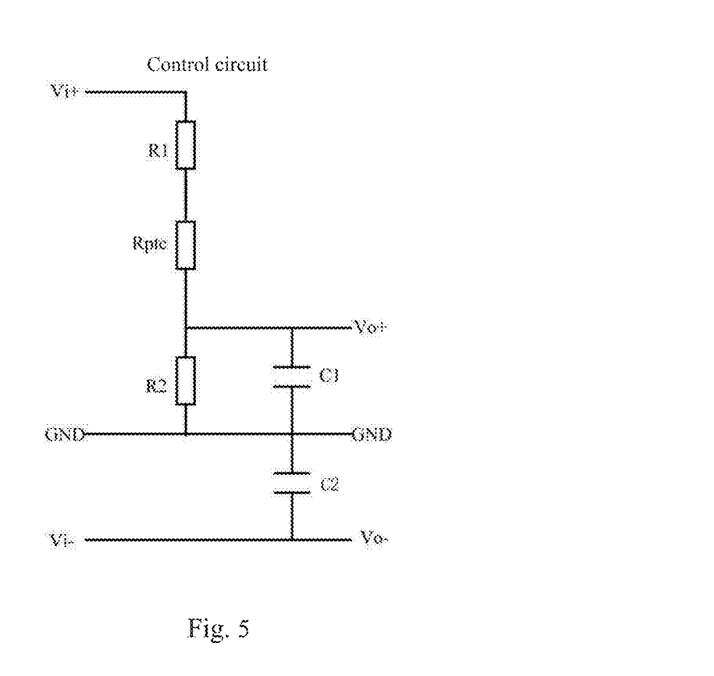
FIG. 5 shows another exemplary circuit diagram of the control circuit in the first example of the present invention.

Another example of the control circuit is shown in FIG. 5 in which the negative temperature coefficient thermistor Rntc in the control circuit shown in FIG. 4 is replaced with a positive temperature coefficient thermistor Rptc, in addition, a node between the second resistor R2 and the thermistor Rptc is connected to the output voltage anode Vo+. For the control circuit, when the temperature of the device is raised, the Rptc is increased, the output voltage Vo+ is reduced, at the moment, the gate voltage Vgs of the device is reduced therewith, the on-resistance Rds-on of the device may be increased, the current Ids passing through the device may be reduced, the temperature of the device is reduced, and therefore, the control circuit is also capable of automatically achieving the adjustment of the temperature of the device.

Therefore, in the exemplary apparatus, the balancing unit adopts a hardware circuit to achieve the balance of the thermal performance of the paralleled devices.

Second example (a balancing approach in which software is adopted)

Figure 6:
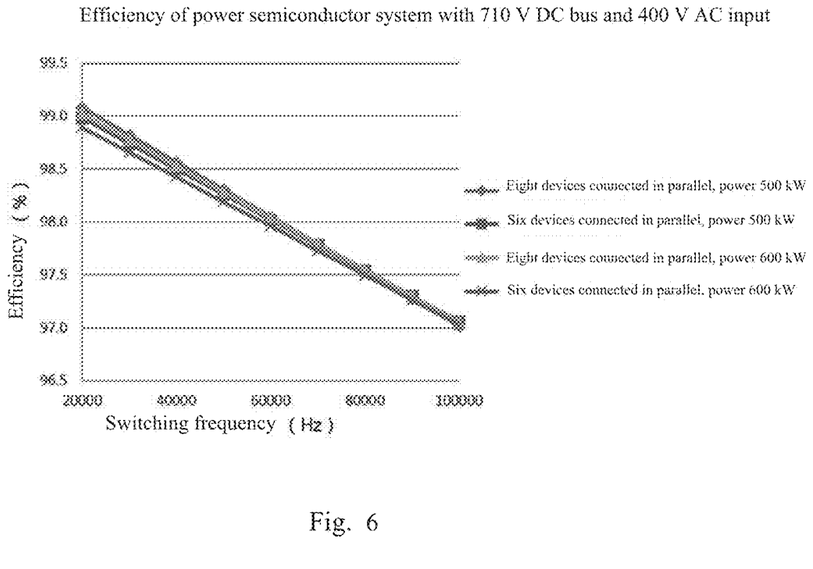
FIG. 6 shows a relationship between a switching frequency and an efficiency of a power semiconductor system when six devices are connected in parallel and eight devices are connected in parallel under the powers of 500 kW and 600 kW.
Figure 7:
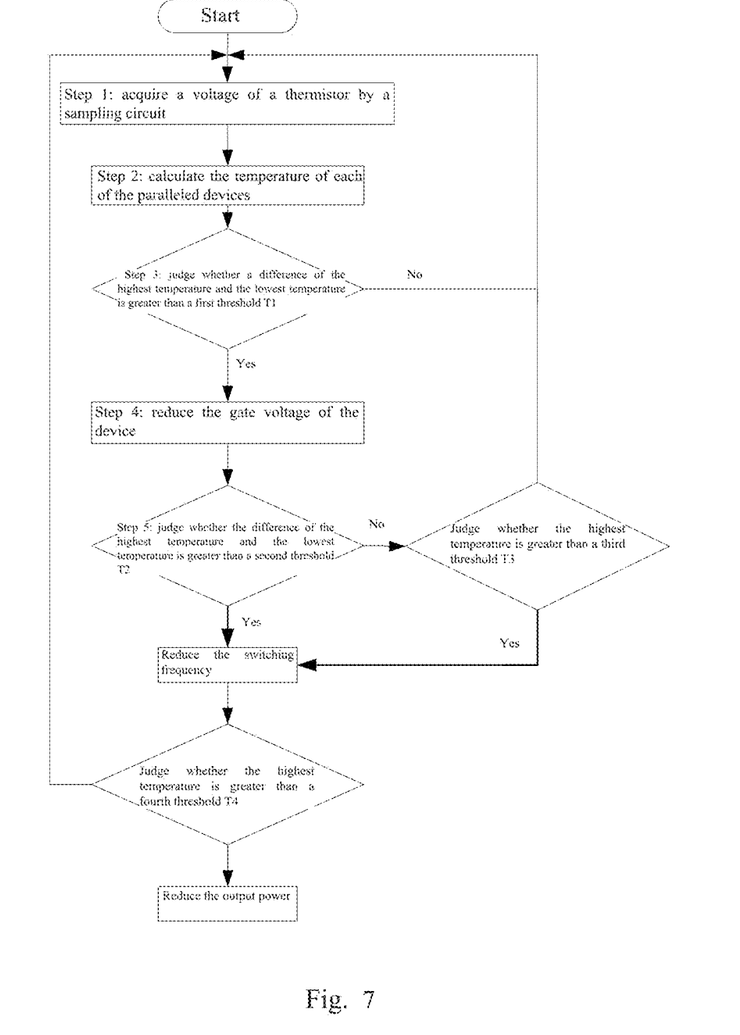
FIG. 7 shows a process diagram of an approach to actively balance the thermal performance of paralleled power devices in a second example of the present invention.

Switching loss mainly depends on a switching frequency. FIG. 6 shows a relationship between a switching frequency and an efficiency of a power semiconductor system when six devices are connected in parallel and eight devices are connected in parallel under the powers of 500 kW and 600 kW. It may be seen from the figure that the efficiency of the system is rapidly reduced with the increment of the switching frequency, which is due to the fact the switching loss may be increased with the increment of the switching frequency. In the example, the temperature of the device is adjusted by adjusting parameters such as a switching frequency, a gate voltage and total power of each power device by virtue of software, so that the thermal performance of the paralleled devices is balanced, that is, the balancing unit in the example includes a software control component used for adjusting the parameters such as the switching frequency, the gate voltage and the total power of each power device. Specifically, the approach to actively balance the thermal performance of the paralleled power devices is described as follows with reference to a process diagram as shown in FIG. 7:

the temperature of each of the paralleled devices is acquired, specifically, a voltage of a thermistor integrated to each of the power devices or attached to the power device is acquired by a sampling circuit, and then, the voltage is converted into the temperature of the device;

it is judged whether a difference of the highest temperature and the lowest temperature is greater than a first threshold T1;

if the difference of the highest temperature and the lowest temperature is greater than the first threshold T1, it is judged that the thermal performance of the power device is imbalanced, at the moment, the gate driving voltage of the power device with the highest temperature is reduced by the soft control component;

it is judged whether the difference of the highest temperature and the lowest temperature is greater than a second threshold T2;

if the difference of the highest temperature and the lowest temperature is greater than the second threshold T2, it is judged that the thermal performance of the power device is still imbalanced, at the moment, the switching frequency of the power device with the highest temperature is reduced; and if the difference of the highest temperature and the lowest temperature is smaller than the second threshold T2, it is further judged whether the highest temperature is greater than a third threshold T3, if the highest temperature is greater than the third threshold T3, it is judged that the thermal performance of the power device is still imbalanced, at the moment, the switching frequency is further reduced; and it is further judged whether the highest temperature of the power device is greater than a fourth threshold T4, if the highest temperature is greater than the fourth threshold T4, it is judged that the thermal performance of the power device is still imbalanced, the output power of the system is reduced, the power loss is in direct proportion to the power of the system, and when the power of the system is reduced, the power loss is reduced therewith. In the example, the output power of the system is reduced by reducing the DC bus voltage.

In the aforementioned process, T4>T3>T2>T1.

In the present invention, the adjustment of the power loss of the power devices can be achieved by adjusting any one or more of parameters such as a switching frequency, a gate driving voltage, gate driving resistance and capacitance and a DC bus voltage of each of the power devices, and finally, the balance of the thermal performance of the paralleled power devices can be achieved. These parameters may be adjusted by a hardware circuit or software control, and the mixed adjustment of the hardware circuit and the software control also falls within the scope of the present invention.

By using the approach provided by the present invention, the temperatures of the paralleled power devices can be actively balanced when being monitored to be out of balance, so that the fault rate of the power devices is reduced, the life of each power device of the paralleled power devices is prolonged, and the cost is reduced.

In other embodiments of the present invention, any other manners known in the art are adopted to monitor the temperatures of the power devices.

A UPS system including the apparatus to actively balance the thermal performance of the paralleled power devices in accordance with the present invention is capable of actively balancing the thermal performance, and therefore, the life of the UPS system is greatly prolonged.

Although the present invention has been described with reference to the preferred embodiments, the present invention is not limited to the embodiments described herein. The present invention further includes various changes and variations made without departing from the scope of the present invention.

The invention claimed is:

1. An apparatus comprising:
respective thermistors integrated with or attached to respective power devices of a plurality of paralleled power devices and configured to sense temperatures of the respective power devices; and
respective control circuits comprising the respective thermistors and configured to receive respective input voltages, to generate respective output voltages therefrom responsive to variation of resistances of respective ones of the thermistors, and to apply respective ones of the output voltages to respective power amplifiers that drive respective ones of the power devices to adjust at least one operating parameter of the power amplifiers and thereby balance thermal performance of the plurality of paralleled power devices.

2. The apparatus of claim 1, wherein the control circuits each comprise a first resistor, a negative temperature coefficient thermistor and a second resistor connected in series, and a first capacitor and a second capacitor connected in series wherein a first terminal of the first resistor is connected to a first input voltage node, wherein a node between the first resistor and the thermistor is connected to a first output voltage node, wherein a second terminal of the second resistor is grounded, wherein a first terminal of the first capacitor is connected to the first output voltage node, wherein a second terminal of the first capacitor is grounded and is connected to a first terminal of the second capacitor, and wherein a second terminal of the second capacitor is connected to a second input voltage cathode and a second output voltage node.

3. The apparatus of claim 1, wherein the control circuits each comprise a first resistor, a positive temperature coefficient thermistor and a second resistor connected in series and a first capacitor and a second capacitor connected in series, wherein a first terminal of the first resistor is connected to a first input voltage node, wherein a node between a first terminal of the second resistor and the thermistor is connected to a first output voltage node, wherein a second terminal of the second resistor is grounded, wherein a first terminal of the first capacitor is connected to the first output voltage node, wherein a second terminal of the first capacitor is grounded and is connected to a first terminal of the second capacitor, and wherein a second terminal of the second capacitor is connected to a second input voltage node and a second output voltage node.

4. An uninterruptible power supply (UPS) comprising the apparatus of claim 1.

\* \* \* \* \*